US007710723B2

(12) United States Patent
Korich et al.

(10) Patent No.: US 7,710,723 B2
(45) Date of Patent: May 4, 2010

(54) VEHICLE INVERTER ASSEMBLY WITH COOLING CHANNELS

(75) Inventors: Mark D. Korich, Chino Hills, CA (US); Konstantinos Triantos, San Jose, CA (US); Mark L. Selogie, Manhattan Beach, CA (US)

(73) Assignee: GM Global Technology Operations, Inc., Detroit, MI (US)

(*) Notice: Subject to any disclaimer, the term of this patent is extended or adjusted under 35 U.S.C. 154(b) by 0 days.

(21) Appl. No.: 12/171,841

(22) Filed: Jul. 11, 2008

(65) Prior Publication Data

US 2009/0021971 A1 Jan. 22, 2009

Related U.S. Application Data

(60) Provisional application No. 60/950,297, filed on Jul. 17, 2007.

(51) Int. Cl.
*H05K 7/20* (2006.01)

(52) U.S. Cl. ....................... 361/699; 361/707; 361/721; 165/80.3; 165/80.4; 165/104.33; 174/15.1; 174/16.1; 174/16.3

(58) Field of Classification Search ....................... None
See application file for complete search history.

(56) References Cited

U.S. PATENT DOCUMENTS

| | | | | |
|---|---|---|---|---|
| 5,914,860 | A * | 6/1999 | Janko | 361/710 |
| 6,326,761 | B1 * | 12/2001 | Tareilus | 318/722 |
| 6,972,957 | B2 * | 12/2005 | Beihoff et al. | 361/698 |
| 6,987,670 | B2 * | 1/2006 | Ahmed et al. | 361/699 |
| 7,177,153 | B2 * | 2/2007 | Radosevich et al. | 361/699 |
| 2007/0165376 | A1 * | 7/2007 | Bones et al. | 361/688 |

* cited by examiner

*Primary Examiner*—Boris L Chervinsky
(74) *Attorney, Agent, or Firm*—Ingrassia Fisher & Lorenz, P.C.

(57) ABSTRACT

An inverter assembly for a vehicle includes a housing, a first inverter, and a second inverter. The housing comprises a plurality of walls. The plurality of walls form an inlet for cooling fluid to enter the housing, an outlet for the cooling fluid to exit the housing, and a channel, and a channel for the cooling fluid to flow therebetween. The first inverter is disposed within the housing proximate the channel, and is configured to be cooled by the cooling fluid flowing through the channel. The second inverter is also disposed within the housing proximate the channel, and is also configured to be cooled by the cooling fluid flowing through the channel.

20 Claims, 5 Drawing Sheets

110 702 200 706 218 704 202 205 708 205 710 210 708 205 205 214 204 704 216 706

VEHICLE INVERTER ASSEMBLY WITH COOLING CHANNELS

CROSS-REFERENCES TO RELATED APPLICATIONS

This application claims the benefit of U.S. Provisional Application No. 60/950,297, filed Jul. 17, 2007 (the entire content of which is incorporated herein by reference).

TECHNICAL FIELD

The subject matter described herein generally relates to electric assemblies, and more particularly relates to inverter assemblies for use in vehicles.

BACKGROUND OF THE INVENTION

Hybrid electric, fully electric, fuel cell, and other fuel efficient vehicles are becoming increasingly popular. Electric and hybrid electric vehicles utilize high voltage battery packs or fuel cells that deliver direct current necessary to drive vehicle motors, electric traction systems and other vehicle systems. These vehicles use thick electric current connectors to deliver high power direct current from battery packs, fuel cells, or other power sources to electric motors and other electric devices and systems of the vehicle.

In addition, these vehicles typically include inverters to convert the direct current provided by such battery packs, fuel cells, or other power sources to alternating current for use by such electric motors and other electric devices and systems of the vehicle. However, it may be difficult to provide optimal cooling for such inverters and any components used in conjunction therewith that may require cooling, for example to avoid overheating. In addition, such inverters and components consume space and weight within the vehicle systems. Such space and weight can often be at a premium in today's hybrid and fuel cell vehicles, particularly with the increasing complexity and additional features often included in such vehicles. Moreover, manufacturing inverters and assemblies relating thereto can result in substantial time and monetary costs, for example as specialized tools are generally used to manufacture such inverter assemblies.

Accordingly, it is desirable to provide improved inverter assemblies for vehicles, for example that provide improved cooling of the inverters and other components of the inverter assemblies. It also is desirable to provide improved inverter assemblies that potentially consume less space and/or weight in a vehicle. In addition, it is desirable to provide improved inverter assemblies that are potentially less costly to produce as compared to typical inverter assemblies for vehicles. Furthermore, other desirable features and characteristics of the present invention will be apparent from the subsequent detailed description and the appended claims, taken in conjunction with the accompanying drawings and the foregoing technical field and background.

SUMMARY OF THE INVENTION

In accordance with an exemplary embodiment of the present invention, an inverter assembly for a vehicle is provided. The inverter assembly comprises a housing, a first inverter, and a second inverter. The housing comprises a plurality of walls. The plurality of walls form an inlet for cooling fluid to enter the housing, an outlet for the cooling fluid to exit the housing, and a channel, and a channel for the cooling fluid to flow therebetween. The first inverter is disposed within the housing proximate the channel, and is configured to be cooled by the cooling fluid flowing through the channel. The second inverter is also disposed within the housing proximate the channel, and is also configured to be cooled by the cooling fluid flowing through the channel.

In accordance with another exemplary embodiment of the present invention, another inverter assembly for a vehicle is provided. The inverter assembly comprises a housing, a first inverter, a second inverter, and a third inverter. The housing has a first side wall, a second side wall, a first end wall, a second end wall, a top wall, and a bottom wall. The first end wall has an inlet for cooling fluid to enter the housing and an outlet for the cooling fluid to exit the housing. A channel for cooling fluid to flow therethrough extends between the inlet and the outlet. The first inverter is disposed within the housing proximate the channel, and is configured to be cooled by the cooling fluid flowing through the channel. The second inverter is also disposed within the housing proximate the channel, and is also configured to be cooled by the cooling fluid flowing through the channel. The third inverter is disposed within the housing proximate the channel, and is also configured to be cooled by the cooling fluid flowing through the channel.

In accordance with a further exemplary embodiment of the present invention, yet another inverter assembly for a vehicle is provided. The inverter assembly comprises a housing, a first inverter, a second inverter, and a third inverter. The housing comprises a plurality of walls. The first inverter is disposed within a first portion of the housing that is proximate a first wall of the plurality of walls. The second inverter is also disposed within the first portion of the housing. The third inverter is disposed within a second portion of the housing that is proximate a second wall of the plurality of walls. The second wall is adjacent to the first wall.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely exemplary in nature, and is not intended to limit the invention or the application and uses of the invention. Furthermore, there is no intention to be bound by any expressed or implied theory presented in the preceding technical field, background, brief summary or the following detailed description.

Figure 1:
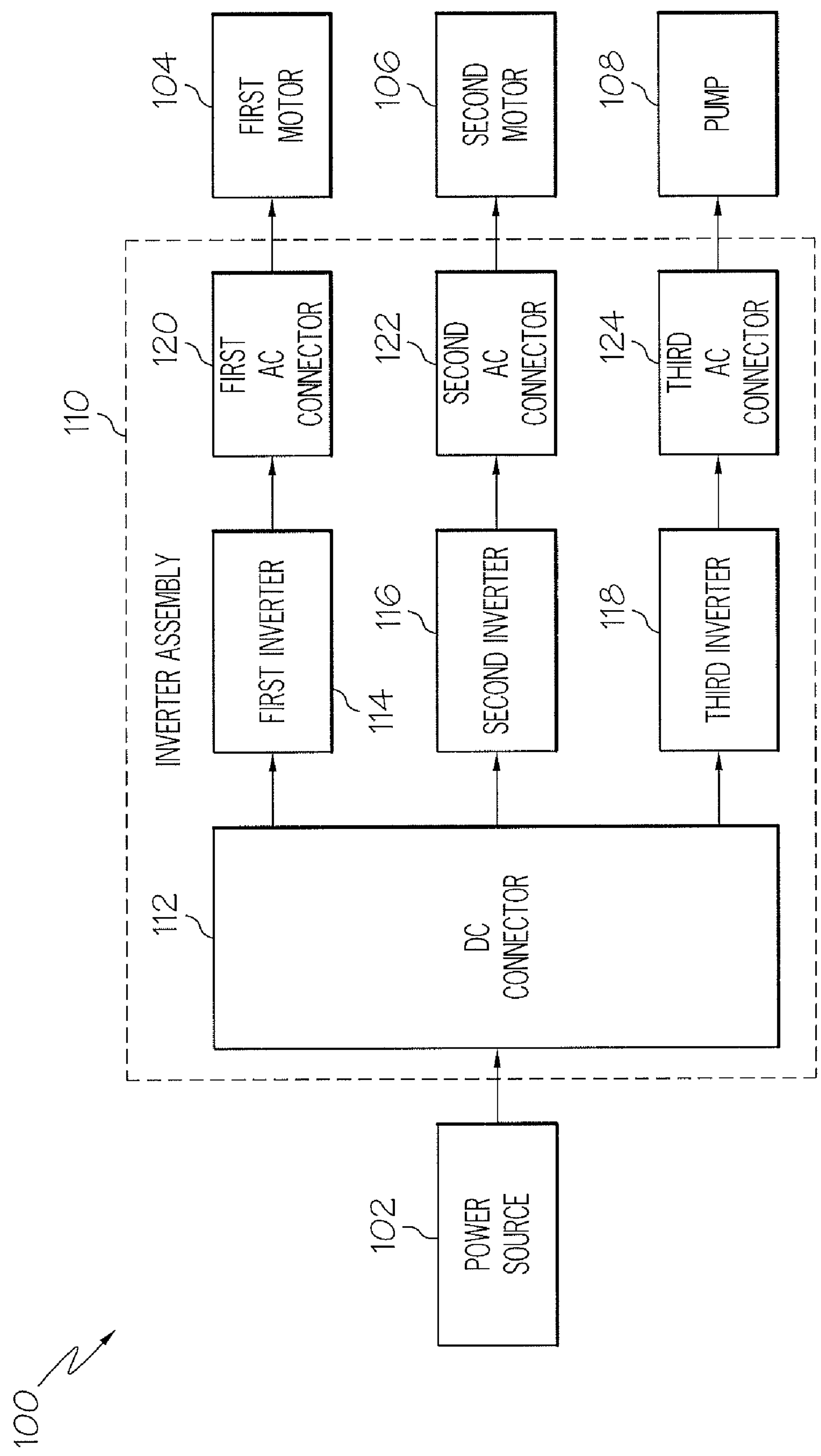
FIG. 1 is a functional block diagram of a motor system of a vehicle that includes a power source, an inverter assembly, two motors, and a pump, in accordance with an exemplary embodiment of the present invention.

FIG. 1 is a functional block diagram of a motor system 100 of a vehicle, in accordance with an exemplary embodiment of the present invention. The vehicle may be any one of a number of different types of automobiles, such, as, for example, a sedan, a wagon, a truck, a van, a sport utility vehicle (SUV), or any one of a number of other different types of automobiles or other vehicles. The vehicle may also include any one or more different types of engines, such as, for example, a gasoline or diesel fueled combustion engine, a flex fuel vehicle (FFV) engine that uses a mixture of gasoline and alcohol, a gaseous compound engine that uses a gaseous compound such as hydrogen and natural gas, a combustion/electric motor hybrid engine, an electric motor, or a fuel cell motor.

As depicted in FIG. 1, the motor system 100 includes a power source 102, a first motor 104, a second motor 106, a pump 108, and an inverter assembly 110. The power source 102 may include one or more batteries, fuel cells, and/or any number of other different types of power sources. The first and second motors 104, 106 may be different types of motors of the vehicle. In a preferred embodiment, the pump 108 is an oil pump that pumps oil for use in a non-depicted transmission system of the vehicle. It will be appreciated that the number of power sources, inverter assemblies, motors, and pumps may vary from the depicted embodiments.

In the depicted embodiment, the power source 102 provides direct current to the inverter assembly 110. The inverter assembly 110 receives the direct current from the power source 102, converts the direct current to alternating current, and provides the alternating current to the first motor 104, the second motor 106, and the pump 108. It will be appreciated that in other embodiments the inverter assembly 110 may receive direct current from multiple power sources. It will similarly be appreciated that in other embodiments the inverter assembly 110 may supply alternating current to one or more other devices instead of or in addition to one or more of the first motor 104, the second motor 106, and the pump 108 depicted in FIG. 1.

Figure 2:
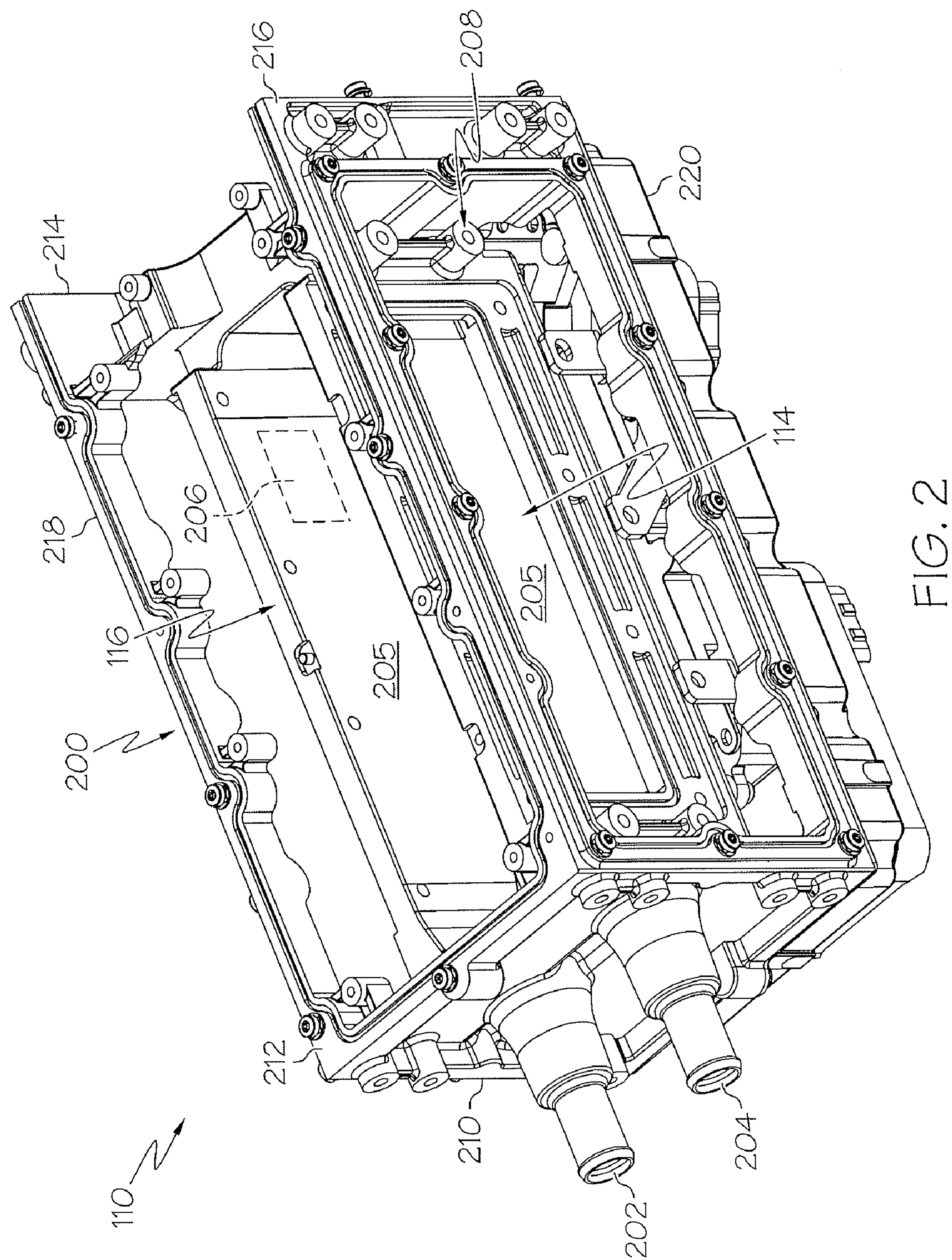
FIG. 2 is a perspective drawing of the inverter assembly of FIG. 1, shown from a first perspective angle, in accordance with an exemplary embodiment of the present invention.
Figure 3:
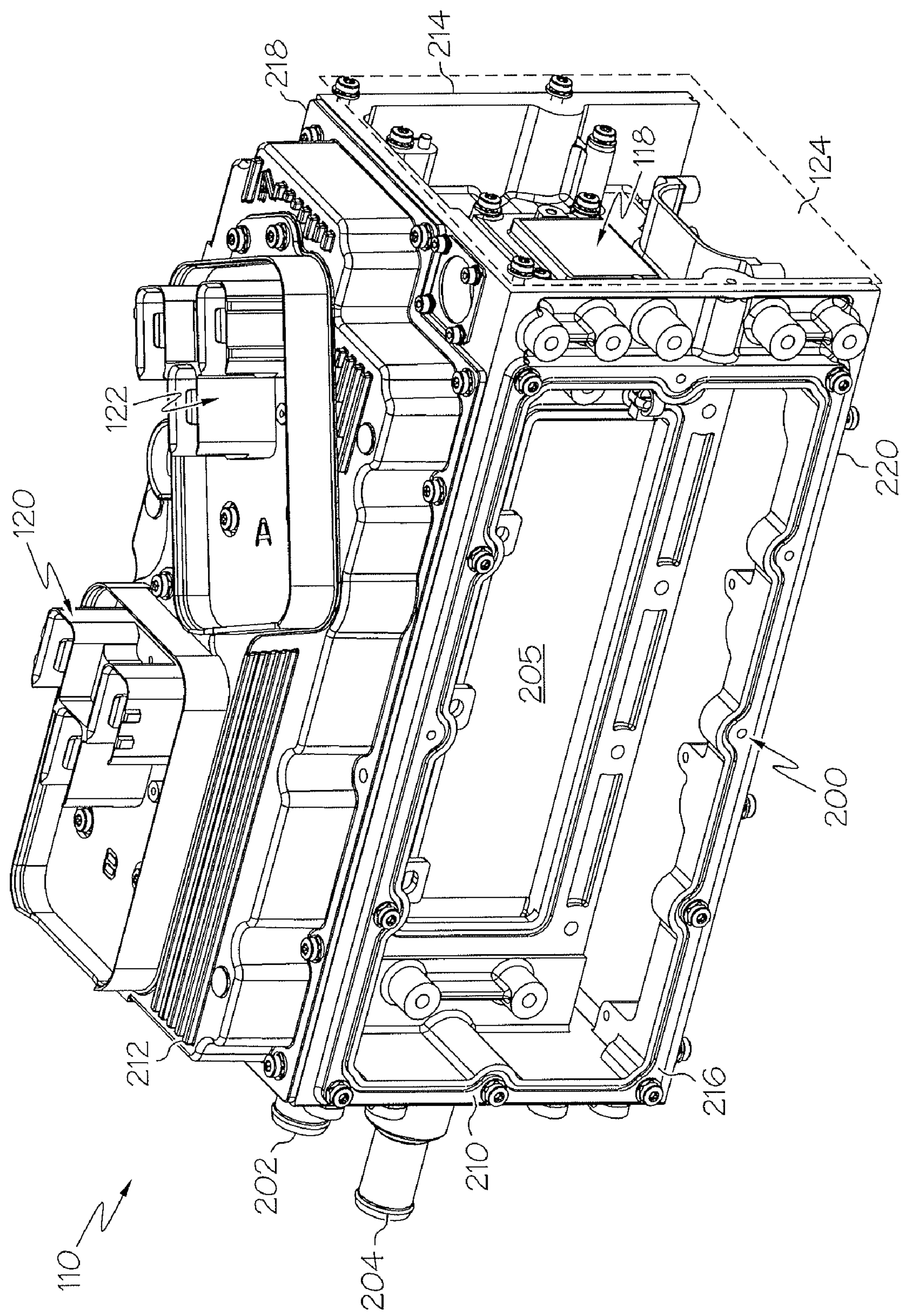
FIG. 3 is another perspective view of the inverter assembly of FIG. 1, shown from a second perspective angle, in accordance with an exemplary embodiment of the present invention.

In the depicted embodiment, the inverter assembly 110 includes a direct current (DC) connector 112, a first inverter 114, a second inverter 116, a third inverter 118, a first alternating current (AC) connector 120, a second AC connector 122, and a third AC connector 125. In a preferred embodiment, the DC connector 112, the first inverter 114, the second inverter 116, the third inverter 118, the first AC connector 120, the second AC connector 122, and the third AC connector 125 are all housed within a common housing, such as the housing 200 that is depicted in FIGS. 2 and 3 and described below in connection therewith. It will be appreciated that the number of DC connectors, inverters, and AC connectors may vary in other embodiments. It will similarly be appreciated that in certain embodiments one or more such DC connectors and/or AC connectors can be considered to be separate from the inverter assembly 110 and instead coupled to the inverter assembly 110, for example depending on how one defines the inverter assembly 110.

The DC connector 112 receives direct current from the power source 102, and transports the direct current to each of the first inverter 114, the second inverter 116, and the third inverter 118. The first inverter 114 converts the direct current that it receives from the DC connector 112 to alternating current and transports this alternating current to the first AC connector 120 which, in turn, transports this alternating current to the first motor 104 for use by the first motor 104. Likewise, the second inverter 116 converts the direct current that it receives from the DC connector 112 to alternating current and transports this alternating current to the second AC connector 122 which, in turn, transports this alternating current to the second motor 106 for use by the second motor 106. Similarly, the third inverter 118 converts the direct current that it receives from the DC connector 112 to alternating current and transports this alternating current to the third AC connector 124 which, in turn, transports this alternating current to the pump 108 for use by the pump 108.

FIGS. 2 and 3 are perspective drawings of the inverter assembly 110 of FIG. 1, shown from two different perspective angles, in accordance with an exemplary embodiment of the present invention. As depicted in FIGS. 2 and 3 and as noted above, preferably each of the components of the inverter assembly 110 are housed at least partially within, and most preferably completely within, the above-referenced housing 200.

Also as depicted in FIGS. 2 and 3, the housing 200 comprises a group of walls that encase the components of the inverter assembly 110 within the housing 200. Specifically, in the depicted embodiment, the group of walls includes a first wall 210 (also referred to as a first end wall, in an exemplary embodiment), a second wall 212 (also referred to as a top wall, in an exemplary embodiment), a third wall 214 (also referred to as a second end wall, in an exemplary embodiment), a fourth wall 216 (also referred to as a first side wall, in an exemplary embodiment), a fifth wall 218 (also referred to as a second side wall, in an exemplary embodiment), and a sixth wall 220 (also referred to as a bottom wall, in an exemplary embodiment).

In FIGS. 2 and 3, certain of the walls are shown as at least partially removed in order to depict components inside the housing 200. For example, FIG. 2 depicts the fourth wall 216 and the fifth wall 218 as partially removed in order to depict components within the housing 200. Similarly, FIG. 3 depicts the third wall 214 and the fourth wall 216 as partially removed for similar illustrative purposes.

The first wall 210 and the third wall 214 (i.e., the two end walls, in an exemplary embodiment) are parallel to one another and are disposed on opposite sides of the housing 200. The second wall 212 and the sixth wall 220 (i.e., the top and bottom walls, respectively, in an exemplary embodiment) are likewise parallel to one another and are disposed on opposite sides of the housing 200. Similarly, the fourth wall 216 and the fifth wall 218 (i.e., the two side walls, in an exemplary embodiment) are parallel to one another and are disposed on opposite sides of the housing 200. Unless otherwise noted above, each of the group of walls is perpendicular to four corresponding adjoining walls (i.e., the four remaining walls of the group of walls that are not parallel to such wall) and contacts such corresponding adjoining walls at respective edges thereof.

Each of the group of walls preferably forms a respective surface that is at least substantially flat. This allows for potentially reduced manufacturing costs. For example, due to the flat surfaces formed by the respective walls, specialized tools are not required to hold the inverter assemblies in place and turn them over on various sides thereof as they are being manufactured and assembled, as is commonly required in manufacturing and assembling typical inverter assemblies.

The group of walls form an inlet 202, an outlet 204, and a channel 205. Cooling fluid enters through the inlet 202 and flows through the channel 205 within the housing 200. The cooling fluid cools components of the inverter assembly 110 that are disposed near the channel 205, and the cooling fluid then exits the housing 200 via the outlet 204.

In the depicted embodiment, the inlet 202 and the outlet are both formed at least partially within the first wall 210 (i.e., the first end wall, in an exemplary embodiment). Also in the depicted embodiment, the channel 205 runs from a beginning point proximate the first wall 210 (i.e., the first end wall, in an exemplary embodiment) via the inlet 202 toward the third wall 214 (i.e., the second end wall, in an exemplary embodiment) in a direction that is at least approximately parallel to the fourth wall 216 and the fifth wall 218 (i.e., the two side walls, in an exemplary embodiment). The channel 205 preferably nearly reaches the third wall 214 (i.e. the second end wall, in an exemplary embodiment). At this point, the channel 205 turns approximately ninety degrees and extends along the third wall 214 (i.e., the second end wall, in an exemplary embodiment) until the channel 205 nearly reaches the fifth wall 218 (i.e., the second side wall, in an exemplary embodiment). At this point, the channel 205 turns approximately ninety degrees again and extends along the fifth wall 218 (i.e., the second side wall, in an exemplary embodiment) until an ending point in which the channel 205 reaches the outlet 204 proximate the first wall 210 (i.e., the first end wall, in an exemplary embodiment). However, this may vary in other embodiments. For example, the inlet 202 and the outlet 204 may be transposed from the depiction in FIGS. 2 and 3, among other possible variations in other embodiments.

As shown in FIGS. 2 and 3, the first inverter 114 and the second inverter 116 of FIG. 1 are both disposed in a first portion of the housing 200 proximate the second wall 212 (i.e., the top wall, in an exemplary embodiment) (as depicted in FIG. 2), while the third inverter 118 of FIG. 1 is disposed in a second portion of the housing 200 proximate the third wall 214 (i.e., the second end wall, in an exemplary embodiment) (as depicted in FIG. 3). In addition, also as depicted in FIG. 3, the first AC connector 120 and the second AC connector 122 of FIG. 1 are preferably housed along the second wall 212 (i.e., the top wall, in an exemplary embodiment). The third AC connector 124 of FIG. 1 (depicted in phantom in FIG. 3) is preferably housed along the third wall 214 (i.e., the second end wall, in an exemplary embodiment). However, this configuration may vary in other embodiments. The first, second, and third connectors 120, 122, and 124 are coupled to the first, second, and third inverters 114, 116, and 118, preferably by respective groups of busbars that extend therebetween (not depicted in FIGS. 2 and 3).

The first inverter 114, the second inverter 116, and the third inverter 118 are, as mentioned above, each disposed proximate the channel 205, and thus are cooled by cooling fluid as it flows through the channel 205 within the housing 200 between the inlet 202 and the outlet 204. In addition, various other components of the inverter assembly 110 are also cooled by the cooling fluid. For example, the inverter assembly 110 preferably includes various EMI filtering devices, such as a capacitor housing 206 and an EMI shield 208 as depicted in FIG. 2, that are similarly disposed proximate the channel 205 and cooled by the cooling fluid flowing through the channel 205.

Figure 4:
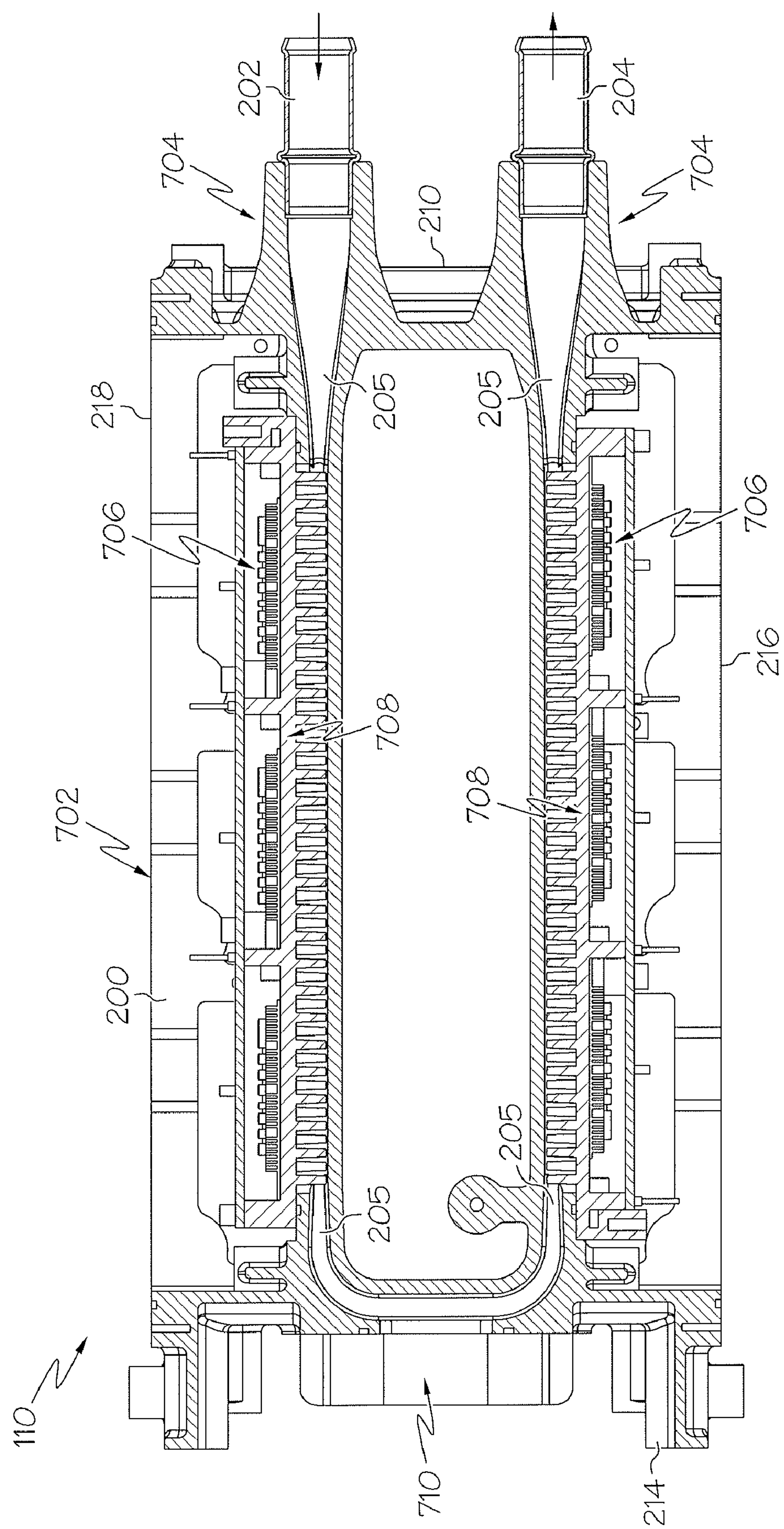
FIG. 4 is a cross sectional view of a portion of the inverter assembly of FIG. 1, depicting an inlet, an outlet, and a channel for cooling fluid to flow therethrough, and shown along with various components of the inverter assembly that are cooled thereby, in accordance with an exemplary embodiment of the present invention.

FIG. 4 is a cross sectional view of a portion of the inverter assembly 110 of FIG. 1, depicting the inlet 202, the outlet 204, and the channel 205 thereof, and shown along with various components of the inverter assembly 110 that are cooled thereby, in accordance with an exemplary embodiment of the present invention. As shown in FIG. 4, in a preferred embodiment, the housing 200 includes a coolant manifold 702 around the perimeter thereof. In a preferred embodiment, the coolant manifold 702 is made of cast aluminum. However, this may vary in other embodiments. In a preferred embodiment, the coolant manifold 702 comprises the first, second, third, fourth, fifth, and sixth walls 206, 208, 210, 212, 214, and 216 of FIG. 3.

Also as shown in FIG. 4, the inlet 202 and the outlet 204 preferably each include coolant fittings 704. The coolant fittings 704 preferably surround portions of the inlet 202 and the outlet 204 as they begin to enter the housing 200 and begin to form the channel 205.

Also as shown in FIG. 4, power modules 706 for the various inverters are preferably disposed within the housing 200 and just outside and nearly adjacent to the channel 205 in a preferred embodiment, in order to facilitate cooling of the power modules 706. In the depicted embodiment, the power modules 706 are aligned parallel to the fourth and fifth walls 216, 218 of FIG. 2 (i.e., also referred to as first and second side walls in accordance with an exemplary embodiment). The power modules 706 are preferably used at least for the first and second inverters 114, 116 of FIG. 1 (not depicted in FIG. 4).

In addition, in a preferred embodiment, the inverter assembly 110 of FIG. 1 also includes two copper heat sinks 708 and one cast heat sink 710, for example as shown in FIG. 4. In the depicted embodiment, the two copper heat sinks 708 are preferably used for the power modules 706. As shown in FIG. 4, the two copper heat sinks 708 are preferably disposed within the housing 200 and just outside and nearly adjacent to the channel 205 in a preferred embodiment, in order to facilitate cooling of the copper heat sinks 708. Also as shown in FIG. 4, the two copper heat sinks 708 are preferably aligned parallel to the fourth and fifth walls 216, 218 of FIG. 2 (i.e., also referred to as first and second side walls in accordance with an exemplary embodiment) and in close proximity to the power modules 706.

In addition, also in the depicted embodiment, a cast heat sink 710 is preferably disposed within the housing 200 and just outside and nearly adjacent to the channel 205 proximate the third wall 214 of FIG. 3 (also referred to as a second end wall) in a preferred embodiment, in order to facilitate cooling of the cast heat sink 710. The cast hat sink 710 is preferably used for the third inverter 118 of FIG. 1 (not depicted in FIG. 4). It will be appreciated that the number, type, position, and/or configuration of the power modules 706 and/or heat sinks 708, 710, and/or other components, may vary in other embodiments.

Figure 5:
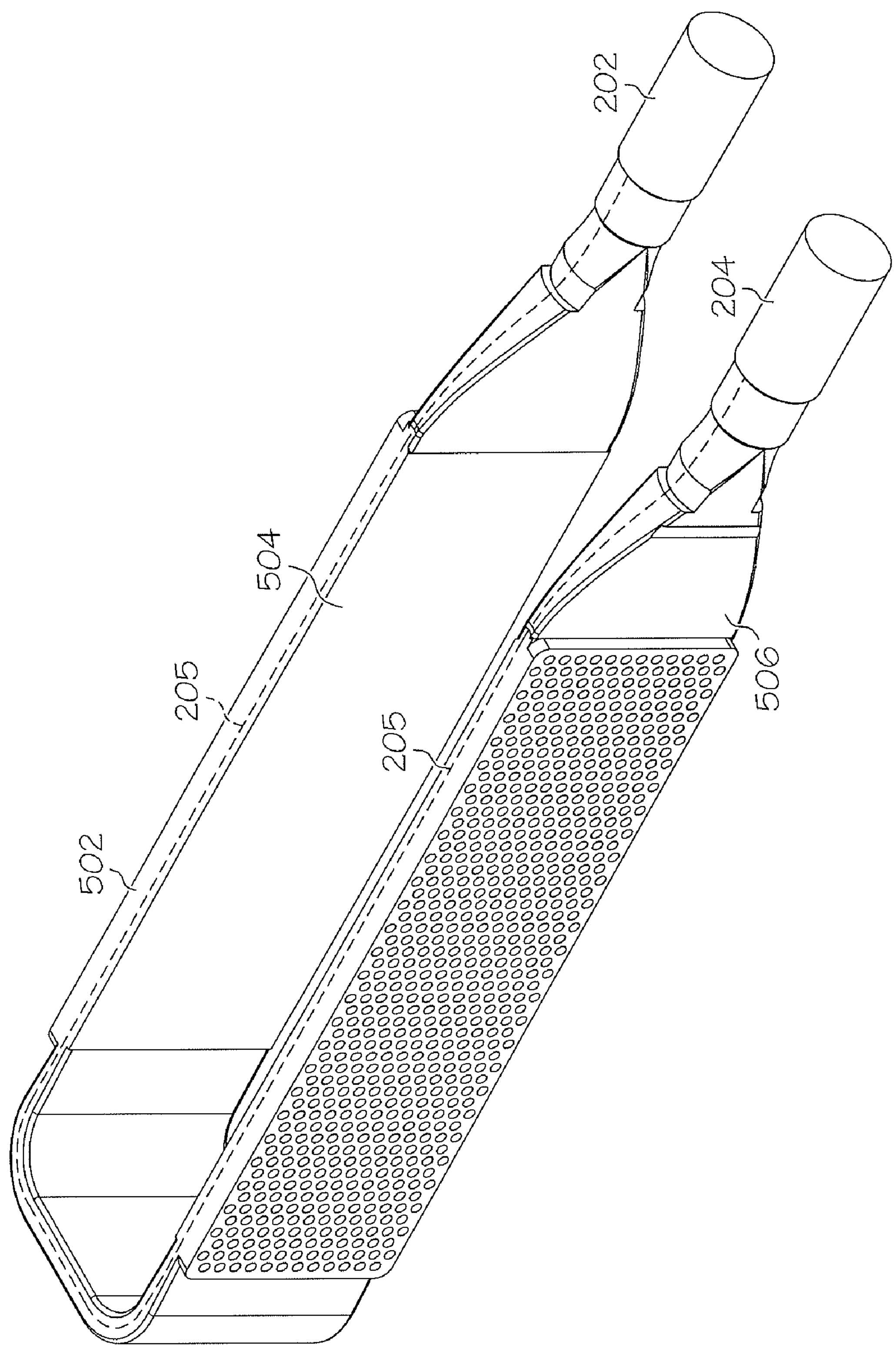
FIG. 5 is a perspective view of the inlet, outlet, and cooling channel of FIG. 4, in accordance with an exemplary embodiment of the present invention.

FIG. 5 is a perspective view of the inlet 102, the outlet 104, and the cooling channel 205 of FIGS. 2-4, in accordance with an exemplary embodiment of the present invention. As shown in FIG. 5, the cooling channel 205 (depicted in phantom in FIG. 5) extends between the inlet 202 and the outlet 204, and is formed by or within one or more walls 502. Specifically, the channel 205 is formed between an inner surface 504 and an outer surface 506 of the one or more walls 502.

In certain embodiments, the one or more walls 502 can be considered to be a single wall, for example as depicted in FIG. 5. Also in certain embodiments, the one or more walls 502 can comprise and/or be formed at least partially within the above-referenced first, second, third, fourth, fifth, and sixth walls 210, 212, 214, 216, 218, and 220 of FIG. 2. For example, in certain exemplary embodiments, the first, second, third, fourth, fifth, and sixth walls 210, 212, 214, 216, 218, and 220 of FIG. 2, as joined together, may be considered to collectively form the one or more walls 502 of FIG. 5. In certain other exemplary embodiments, the first, second, one or more separate walls 502 may be formed and/or disposed otherwise within the first, second, third, fourth, fifth, and sixth walls 210, 212, 214, 216, 218, and 220 of FIG. 2.

Also, in certain preferred embodiments, the channel 205 is at least approximately U-shaped, for example as depicted in FIG. 5. However, this may also vary in other embodiments. In addition, in a preferred embodiment, the channel 205 holds at least 0.25 liters of cooling fluid. However, this may also vary in other embodiments.

Accordingly, improved inverter assemblies are provided. In one exemplary embodiment, the improved inverter assemblies provide for improved cooling of the inverters and other components of the inverter assemblies. In another exemplary embodiment, the improved inverter assemblies also consume less space and weight in a vehicle compared with traditional inverter assemblies, for example due to the integration of the multiple inverters and connectors together into a common housing. In addition, in a further exemplary embodiment, the improved inverter assemblies are less costly to produce as compared to typical inverter assemblies for vehicles. Specifically, as a result of the flat surfaces formed by the group of walls that form the housing of the inverter assemblies, specialized tools are not required to hold the inverter assemblies in place and turn them over on various sides thereof as they are being manufactured and assembled, as is commonly required in manufacturing and assembling typical inverter assemblies.

It will be appreciated that the inverter assemblies in various embodiments can be implemented in connection with any number of different types of vehicles and in electrically coupling any number of different types of power sources, motors, pumps, and/or other devices and systems thereof and/or in connection therewith. It will similarly be appreciated that various features and elements of the disclosed inverter assemblies may vary from those depicted in the Figures and/or described herein in certain embodiments.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An inverter assembly for a vehicle, the inverter assembly comprising:

a housing comprising a plurality of walls and a plurality of protrusions extending from a first wall of the plurality of walls, the plurality of walls and the plurality of protrusions at least partially forming an inlet for cooling fluid to enter the housing, an outlet for the cooling fluid to exit the housing, and a channel for the cooling fluid to flow therebetween;

a first inverter disposed within the housing proximate a first portion of the channel along a second wall of the plurality of walls and configured to be cooled by the cooling fluid flowing through the first portion of the channel;

a second inverter disposed within the housing proximate the first portion of the channel and configured to be cooled by the cooling fluid flowing through the first portion of the channel; and a third inverter disposed within the housing proximate a second portion of the channel along a third wall of the plurality of walls, perpendicular to the second wall, and configured to be cooled by the cooling fluid flowing through the second portion of the channel.

2. The inverter assembly of claim 1, wherein the plurality of walls form a plurality of exterior surfaces of the housing, each of the plurality of exterior surfaces being at least substantially flat.

3. The inverter assembly of claim 1, wherein the inlet and the outlet are formed at least partially within respective protrusions of the plurality of protrusions.

4. The inverter assembly of claim 3, wherein the first and second inverters are disposed within a first portion of the housing proximate the second wall and the third inverter is disposed within a second portion of the housing proximate the third wall.

5. The inverter assembly of claim 4, further comprising:

a first connector disposed along the second wall and coupled to the first inverter;

a second connector disposed along the second wall and coupled to the second inverter; and a third connector disposed along the third wall and coupled to the third inverter.

6. The inverter assembly of claim 5, wherein the first and second connectors are configured to be further coupled to a first motor and a second motor, respectively, and the third connector is configured to be further coupled to a pump wall.

7. The inverter assembly of claim 4, further comprising:

a cast heat sink disposed within the housing along the third wall and configured to be cooled by the cooling fluid flowing through the second portion of the channel.

8. The inverter assembly of claim 7, wherein the third wall is adjacent to the second wall.

9. The inverter assembly of claim 1, further comprising:

an EMI filtering device housed within the housing proximate the channel and configured to be cooled by the cooling fluid flowing through the channel.

10. An inverter assembly for a vehicle, the inverter assembly comprising:

a housing having a first side wall, a first protrusion extending from the first side wall, a second protrusion extending from the second side wall, a second side wall, a first end wall, a second end wall, a top wall, and a bottom wall, the first end wall and the first protrusion at least partially forming an inlet for cooling fluid to enter the housing, the first end wall and the second protrusion at least partially forming an outlet for the cooling fluid to exit the housing, and wherein a channel for cooling fluid to flow therethrough extends between the inlet and the outlet;

a first inverter disposed within the housing proximate a first potion of the channel along the top wall and configured to be cooled by the cooling fluid flowing through the first portion of the channel;

a second inverter disposed within the housing proximate the first portion of the channel and configured to be cooled by the cooling fluid flowing through the first portion of the channel; and a third inverter disposed within the housing proximate a second portion of the channel at least substantially perpendicular to the first portion of the channel, the third inverter configured to be cooled by the cooling fluid flowing through the second portion of the channel.

11. The inverter assembly of claim 10, wherein the first side wall, the second side wall, the first end wall, the second end wall, the top wall, and the bottom wall form a plurality of exterior surfaces of the housing, each of the plurality of exterior surfaces being at least substantially flat.

12. The inverter assembly of claim 11, wherein the first and second inverters are disposed within a first portion of the housing along the top wall, and the third inverter is disposed within a second portion of the housing along the second end wall.

13. The inverter assembly of claim 12, further comprising:

a first connector housed along the top wall and coupled to the first inverter;

a second connector housed along the top wall and coupled to the second inverter and a third connector housed along the second end wall and coupled to the third inverter.

14. The inverter assembly of claim 13, wherein the first connector is configured to be coupled between the first inverter and a first motor, the second connector is configured to be coupled between the second inverter and a second motor, and the third connector is configured to be coupled between the third inverter and a pump.

15. An inverter assembly for a vehicle, the inverter assembly comprising:

a housing comprising a plurality of walls;

a first inverter disposed within a first portion of the housing along a first wall of the plurality of walls;

a second inverter disposed within the first portion of the housing; and a third inverter disposed within a second portion of the housing along a second wall of the plurality of walls, the second wall being perpendicular to the first wall.

16. The inverter assembly of claim 15, wherein the first wall is adjacent to the second wall.

17. The inverter assembly of claim 16, wherein:

the housing further comprises a plurality of protrusions extending from a third wall of the plurality of walls that at least partially form an inlet for cooling fluid to enter the housing, an outlet for the cooling fluid to exit the housing, and a channel for the cooling fluid to flow therebetween; and the first, second, and third inverters are configured to be cooled by the cooling fluid flowing through the channel.

18. The inverter assembly of claim 17, wherein the inlet is also formed at least partially within the third wall.

19. The inverter assembly of claim 18, further comprising:

a first connector disposed along the first wall and coupled to the first inverter;

a second connector disposed along the first wall and coupled to the second inverter; and a third connector disposed along the second wall and coupled to the third inverter.

20. The inverter assembly of claim 16, wherein the plurality of walls form a plurality of exterior surfaces of the housing, each of the plurality of exterior surfaces being at least substantially flat.

* * * * *